US009322731B2

United States Patent
Binkhoff

(10) Patent No.: US 9,322,731 B2
(45) Date of Patent: Apr. 26, 2016

(54) METHOD FOR MEASURING A MICROELECTROMECHANICAL SEMICONDUCTOR COMPONENT

(75) Inventor: Peter Binkhoff, Dortmund (DE)

(73) Assignee: ELMOS Semiconductor AG, Dortmund (DE)

( * ) Notice: Subject to any disclaimer, the term of this patent is extended or adjusted under 35 U.S.C. 154(b) by 309 days.

(21) Appl. No.: 13/990,337

(22) PCT Filed: Dec. 5, 2011

(86) PCT No.: PCT/EP2011/071762
§ 371 (c)(1), (2), (4) Date: May 29, 2013

(87) PCT Pub. No.: WO2012/072818
PCT Pub. Date: Jun. 7, 2012

(65) Prior Publication Data
US 2013/0263643 A1    Oct. 10, 2013

(30) Foreign Application Priority Data
Dec. 3, 2010 (EP) .................................. 10193596

(51) Int. Cl.
| G01L 9/00 | (2006.01) |
| B81C 99/00 | (2010.01) |
| G01L 27/00 | (2006.01) |
| G01R 31/27 | (2006.01) |
| G01R 31/28 | (2006.01) |

(52) U.S. Cl.
CPC .............. *G01L 9/0098* (2013.01); *B81C 99/003* (2013.01); *B81C 99/005* (2013.01); *G01L 27/002* (2013.01); *G01R 31/275* (2013.01); *G01R 31/2887* (2013.01); *G01R 31/2891* (2013.01)

(58) Field of Classification Search
CPC ...................................................... G01L 27/005
See application file for complete search history.

(56) References Cited

U.S. PATENT DOCUMENTS

| 5,637,905 A * | 6/1997 | Carr ....................... G01L 9/0042 257/418 |
| 2007/0068263 A1* | 3/2007 | Reinwald .............. G01L 27/005 73/714 |
| 2007/0080695 A1* | 4/2007 | Morrell ................. B81C 99/004 324/658 |

OTHER PUBLICATIONS

Patil et al., "Characterization of MEMS piezoresistive pressure sensors using AFM," Ultramicroscopy 110(9): 1154-1160 (2010).

* cited by examiner

*Primary Examiner* — Hezron E Williams
*Assistant Examiner* — Mark A Shabman
(74) *Attorney, Agent, or Firm* — Dardi & Herbert, PLLC; Peter S. Dardi

(57) ABSTRACT

Methods are directed to checking a pressure sensor comprising a reversibly deformable, in particular reversibly bendable measuring element which supplies a measurement signal having a value depending on the degree of deformation of said measuring element, to the effect of whether the pressure sensor withstands a required maximum pressure which is larger by a predeterminable factor than a nominal pressure for which the sensor is designed. The methods generally involve use of a reference pressure sensor, which is structurally identical to the pressure sensor to be checked, for generating a distance/pressure characteristic curve and for evaluating the critical pressure required for breaking the measuring element. The critical pressure can then be used to determine if a particular value of pressure is larger than the required maximum pressure that the pressure sensor to be checked is intended to withstand.

13 Claims, 1 Drawing Sheet

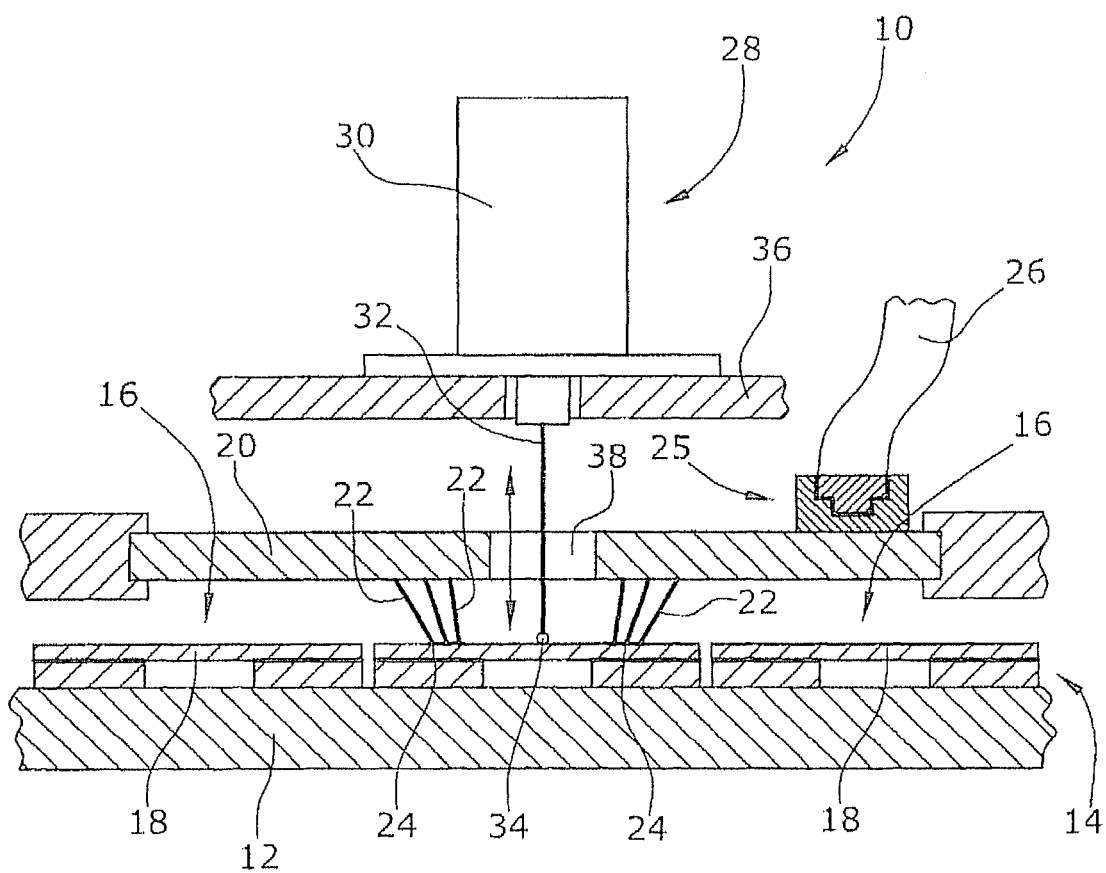

METHOD FOR MEASURING A MICROELECTROMECHANICAL SEMICONDUCTOR COMPONENT

CROSS REFERENCE TO RELATED APPLICATIONS

This application is a national stage filing of PCT application number PCT/EP2011/071762 filed on Dec. 5, 2011, which claims priority to European patent application number 10193596.3 filed on Dec. 3, 2010, both of which are incorporated herein by reference.

The invention relates to a method for measuring a microelectromechanical semi conductor component which comprises a reversibly deformable pressure-sensitive measuring element and electronic circuit elements as well as terminal pads for tapping measurement signals.

Microelectromechanical semiconductor components are microcomponents of semiconductor material having both mechanical and electrical functions. Thus these semiconductor components comprise movable and/or deformable elements which may serve for the metrological detection of physical variables, for example. A group of microelectromechanical semiconductor components comprises pressure sensors, for example, which include a reversibly deformable pressure-sensitive measuring element mostly in the form of a membrane. Besides such a (e. g. measuring) element the semiconductor components comprise electronic circuit elements as well as evaluation circuits and terminal pads for tapping measurement signals, if required. In the case of a pressure sensor the circuit elements comprise such elements which detect the mechanical stresses occurring during deformation of the measuring elements. These circuit elements are pressure-sensitive transistors or resistors, for example, which are integrated in the measuring element and are arranged in a bridge circuit, for example.

Microelectromechanical semiconductor components are produced, like integrated semiconductor circuits, on a semiconductor substrate wafer. These wafers are subjected to a wafer test in a so-called wafer prober; during the test of the microelectromechanical semiconductor components the latter are thus not yet separated. It is common practice to test not only the electrical but also the mechanical functions of the microelectromechanical semiconductor components during the wafer test. In the case of pressure sensors a dynamic pressure method is applied, for example, wherein an air flow is blown on the semiconductor component to be tested. Further, it is common practice to arrange a pressure chamber above the wafer and then to test the wafer in this atmospheric environment inside the wafer prober test assembly. Finally, the wafer prober assembly may also be completely placed in a pressure chamber for testing the pressure sensors on the wafer. In all aforementioned cases the pressure applied from outside causes a deflection of the reversibly deformable measuring element proportionally to the applied pressure.

From Patil S K et al.: "Characterization of MEMS piezoresistive pressure sensors using AFM", ULTRAMICROSCOPY, ELSEVIER, AMSTERDAM, NL, vol. 110, no. 9, Aug. 1, 2010 (2010-08-01), pages 1154-1160, XP027174554, ISSN: 0304-3991 a test method for MEMS pressure sensors is known, wherein a plunger mechanically acts upon the pressure-sensitive measuring element at a predeterminable force and the measurement signal supplied by the pressure sensor is evaluated. In this case a force sensor for the plunger is required which involves further hardware costs and requires calibration of the force sensor.

US-A-2007/0080695 describes a test assembly as well as a test method for capacitive MEMS sensors having a movable (capacitor) plate which is mechanically moved.

The known test methods for microelectromechanical semiconductor components are relatively complex and require a wafer prober test assembly substantially modified with regard to the equipment as compared with integrated circuits. Further, they are subject to restrictions with regard to the pressure range and/or the test setups for various thicknesses of the pressure-sensitive measuring elements must be of different configurations.

Operators using pressure sensors sometimes require that these pressure sensors are designed for a specific operating range and moreover must be capable of withstanding even maximum pressures which may amount to a multiple of a nominal pressure.

It is an object of the invention to provided a method and a device for measuring a microelectromechanical semiconductor component, said method and device comprising a simplified equipment setup.

According to the invention, this object is achieved with a method for checking a pressure sensor having a reversibly deformable, in particular reversibly bendable measuring element which supplies a measurement signal having a value depending on the degree of deformation of said measuring element, to the effect of whether the pressure sensor withstands a required maximum pressure which is larger by a predeterminable factor than a nominal pressure for which the pressure sensor is designed, wherein in the method a reference pressure sensor is provided which is structurally identical to the pressure sensor to be checked and which has a reversibly deformable, in particular reversibly bendable measuring element which supplies a measurement signal having a value depending on the degree of deformation of said measuring element (wherein in particular up to a predetermined degree of a reversible deformation of the measuring element the dependence of the value of the measurement signal on the reversible deformation of the measuring element is known as a distance/pressure characteristic curve, and wherein the critical pressure required for breaking the measuring element (i. e. that pressure at which the measuring element has reached its maximum deformation without having been broken) is larger than the required maximum pressure that the pressure sensor to be checked is intended to withstand), a deflection plunger that can be advanced in a distance-controlled manner is provided, wherein the deflection plunger with the exception of the reference pressure sensor or a pressure sensor to be checked is free of a sensor operatively connected thereto for determining the force respectively required for advancing the deflection plunger, the deflection plunger is brought into contact with the measuring element of the reference pressure sensor and is subsequently advanced in a distance-controlled manner with reversible deformation of the measuring element, the measuring element is increasingly deformed by the deflection plunger advanced in a distance-controlled manner until the measuring element breaks, the measurement signals supplied by the measuring element during increasing deformation thereof are detected, the distance covered by the deflection plunger from the beginning of the reversible deformation of the measuring element up to breakage of the measuring element is determined, the value of the measurement signal upon maximum reversible deformation of the measuring element, without the latter having been broken, is determined as a critical measurement signal, the value of the critical pressure (i. e. that pressure at which the measuring element has reached its maximum deformation without having been broken) corresponding to the critical measurement signal or the value of a parameter representing said pressure is determined on the basis of the known distance/pressure characteristic curve of the reference pressure sensor, the measuring element of at least one pressure sensor to be checked is reversibly deformed up to a predeterminable degree by means of the deflection plunger advanced in a distance-controlled manner and its distance/pressure characteristic curve is created, and a comparison of the created distance/pressure characteristic curve of the pressure sensor to be checked with the known pressure/distance characteristic curve of the reference pressure sensor is used as a basis for identifying whether the measuring element of the pressure sensor to be checked withstands the required maximum pressure or would break or would already have been broken at said pressure (i. e. it is checked whether the measuring element of the pressure sensor to be checked would break at a critical pressure of the same value as that of the reference pressure sensor or another critical pressure, and whether in the latter case the other critical pressure lies above the required maximum pressure).

According to another variant of the invention, the object of the invention is achieved with a method for checking a pressure sensor having a reversibly deformable, in particular reversibly bendable measuring element which supplies a measurement signal having a value depending on the degree of deformation of said measuring element, to the effect of whether the pressure sensor withstands a required maximum pressure which is larger by a predeterminable factor than a nominal pressure for which the pressure sensor is designed, wherein in the method a reference pressure sensor is provided which is structurally identical to the pressure sensor to be checked and which has a reversibly deformable, in particular reversibly bendable measuring element which supplies a measurement signal having a value depending on the degree of deformation of said measuring element (wherein in particular up to a predetermined degree of a reversible deformation of the measuring element the dependence of the value of the measurement signal on the reversible deformation of the measuring element is known as a distance/pressure characteristic curve, and wherein the critical pressure required for breaking the measuring element (i. e. that pressure at which the measuring element has reached its maximum deformation without having been broken) is larger than the required maximum pressure that the pressure sensor to be checked is intended to withstand), a deflection plunger that can be advanced in a distance-controlled manner is provided, wherein the deflection plunger with the exception of the reference pressure sensor or a pressure sensor to be checked is free of a sensor operatively connected thereto for determining the force respectively required for advancing the deflection plunger, the deflection plunger is brought into contact with the measuring element of the reference pressure sensor and is subsequently advanced in a distance-controlled manner with reversible deformation of the measuring element, the measuring element is increasingly deformed by the deflection plunger advanced in a distance-controlled manner until the measuring element breaks, the measurement signals supplied by the measuring element during increasing deformation thereof are detected, the distance covered by the deflection plunger from the beginning of the reversible deformation of the measuring element up to breakage of the measuring element is determined, the value of the measurement signal upon maximum reversible deformation of the measuring element, without the latter having been broken, is determined as a critical measurement signal, the value of the critical pressure (i. e. that pressure at which the measuring element has reached its maximum deformation without having been broken) corresponding to the critical measurement signal or the value of a parameter representing said pressure is determined on the basis of the known distance/pressure characteristic curve of the reference pressure sensor, the value of the maximum distance of the deflection plunger, at which the measuring element is deformed at the required maximum pressure, is determined on the basis of the value of the maximum distance covered by the deflection plunger from the beginning of the reversible deformation of the measuring element up to its maximum reversible deformation and the distance/pressure characteristic curve of the reference pressure sensor, and the measuring element of at least one pressure sensor to be checked is deflected by means of the distance-controlled deflection plunger, wherein the deflection plunger is advanced by the maximum distance as from the place of its contacting the measuring element and it is thus checked whether the measuring element withstands the resultant deflection.

Finally, the invention provides a method for determining the value of a critical pressure (i. e. that pressure at which the measuring element has reached its maximum deformation without having been broken) which a pressure sensor having a measuring element withstands without breakage of the measuring element, wherein the measuring element supplies a measurement signal with a value varying up to a predetermined degree of reversible deformation depending on the latter in accordance with a known distance/pressure characteristic curve, and wherein the determination of the value of the critical pressure (i. e. that pressure at which the measuring element has reached its maximum deformation without having been broken) is carried out without the pressure sensor being subjected to the critical pressure (i. e. that pressure at which the measuring element has reached its maximum deformation without having been broken), and wherein in the method a deflection plunger that can be advanced in a distance-controlled manner is provided, wherein the deflection plunger with the exception of the reference pressure sensor or a pressure sensor to be checked is free of a sensor operatively connected thereto for determining the force respectively required for advancing the deflection plunger, the deflection plunger is brought into contact with the deformable measuring element and is subsequently advanced in a distance-controlled manner with reversible deformation of the measuring element, the measuring element is deformed by the deflection plunger being advanced until the measuring element breaks, the measurement signals supplied by the measuring element during increasing deformation thereof are detected, the distance covered by the deflection plunger from the beginning of the deformation of the measuring element up to breakage of the measuring element is determined, the value of the measurement signal upon maximum reversible deformation, without the measuring element having been broken, is determined as a critical measurement signal, and the value of the critical pressure (i. e. that pressure at which the measuring element has reached its maximum deformation without having been broken) corresponding to the critical measurement signal is determined on the basis of the known distance/pressure characteristic curve of the pressure sensor.

Further, the invention provides for use of a deflection plunger, which can be advanced in a distance-controlled manner, for checking the functionality of a reversibly deformable, in particular reversibly bendable measuring element of a pressure sensor by deforming the measuring element by means of the deflection plunger which can be progressively advanced, wherein the force at which the deflection plunger acts upon the measuring element and/or the pressure corresponding to said force which acts upon the measuring element is determined on the basis of measurement signals supplied by the measuring element during increasing deformation thereof.

According to the invention, the measuring element sensitive to mechanical stresses, which is a pressure-sensitive measuring element, for example, is deformed by mechanical action of a plunger which can be advanced step by step, said plunger in particular being a needle. After a and/or after each defined step-by-step advance of the plunger the current measurement signals are tapped via the terminal pads. Thus the characteristic of the measuring element can be determined and the semiconductor component as a whole can be qualified. Further, by means of the method according to the invention and the device according to the invention, respectively, the reversible deformation of the measuring element can be effected in a space-resolved manner, as seen across the geometry of the measuring element, by subjecting the measuring element to the mechanical action of the plunger at different places in several test runs. The measuring element may be a deformable element (membrane) connected to a substrate on four sides or have a triple, double (bridge) or single (cantilever beam) connection, for example. The deformation can be by means of an in particular piezo-resistive transistor or resistor sensitive to mechanical stresses.

Instead of being advanced step by step, the plunger may be continuously moved, for example, wherein the measurement signals are evaluated during deformation of the measuring element at predeterminable time intervals, i. e. after respective defined varyingly strong deflections of the measuring element. In this manner, too, the characteristic of the microelectromechanical semiconductor component can be measured and qualified. Further, a continuous deformation of the measuring element allows the dynamics of the latter to be metrologically detected, wherein for this purpose the velocity at which the plunger is advanced can be changed. However, the latter is also possible during step-by-step advance of the plunger.

As a drive unit for the step-by-step advance of the plunger a piezo-linear motor is suitable, for example; generally any step motor or any other motor or generally any electromechanical actuator or any actuator operating in any other physical manner which allows a reproducible step-by-step advance to be realized can be used.

As mentioned above, the plunger may be configured as a needle. A wafer prober, too, uses (scanning or tapping) needles with the aid of which the terminal pads of a semiconductor circuit are tapped. The method according to the invention can thus be integrated into a wafer prober. The needle deflecting the reversibly deformable measuring element is made of ceramic, glass fiber, plastic material, tungsten or any other material. The point of the plunger and/or the needle contacting the measuring element should be rounded.

In the method according to the invention, first a reference pressure sensor is checked, which is structurally identical with the pressure sensor to be checked. The reference pressure sensor may be a pressure sensor from the plurality of pressure sensors located on a silicon wafer. As described above, the reference pressure sensor is deflected with the aid of the deflection plunger, which can be advanced in a distance-controlled manner, until its reversibly deformable measuring element breaks. The degree of deformation shortly before breakage of the measuring element can be determined on the basis of the distance covered by the deflection plunger up to this point of time. From the distance/pressure characteristic curve known per se of the reference sensor, which has been determined before (for which purpose the reference pressure sensor had possibly to be calibrated) the value of the pressure can be determined at which the measuring element has not yet been broken. This pressure should be larger than the required maximum pressure. Otherwise the reference pressure sensor is unsuitable and thus the other pressure sensors on the wafer would be unsuitable, too. However, this case should be precluded here.

After the reference pressure sensor has been measured in the manner described above, a pressure sensor to be checked is exposed to the advancing deflection plunger which deflects its measuring element. On the basis of the distance/pressure characteristic curve (and/or a characteristic curve representing said distance/pressure characteristic curve) the (static) behavior of the pressure sensor can be determined. By comparing the distance/pressure characteristic curve with the distance/pressure characteristic curve of the reference pressure sensor it can be determined whether the currently checked pressure sensor withstands the maximum pressure without the measuring element having being subjected to the deformation required for exerting said maximum pressure. Alternatively, the deflection plunger may, of course, act upon the pressure sensor to be checked to such an extent as in the case of the reference pressure sensor at maximum reversible deformation of its measuring element (i. e. without breakage of said measuring element).

In a preferred aspect of the invention it is provided that the value of the critical pressure corresponding to the critical measurement signal is determined on the basis of the known distance/pressure characteristic curve of the reference pressure sensor by extrapolation thereof up to the value of the critical measurement signal.

An essential feature of the method according to the invention is the use of a deflection plunger which is adapted to be advanced exclusively in a distance-controlled manner for exerting deformation forces onto the reversibly deformable measuring element of a pressure sensor. The force used by the deflection plunger for pressing against the measuring element and deforming the latter is not measured by the unit including the advancing deflection plunger; thus this unit does not comprise any sensor system for force and/or pressure measurement. Rather, the force and/or the pressure acting upon the measuring element is determined by the measuring element and/or the pressure sensor to be checked. As a result, the deflection plunger does not comprise any load cells or similar force sensors.

The invention allows microelectromechanical semiconductor components (pressure sensors, for example) to be checked with regard to their linearity, their sensitivity, their temperature dependence, their reversibility, with regard to their hysteresis and/or to be checked as to whether these semiconductor components include any measuring element and whether this measuring element is connected to the remaining part of the semiconductor component in a mechanically correct manner. Generally, the invention allows the characteristic of a microelectromechanical semiconductor component to be determined and the semiconductor component to be mechanically measured. In the invention it is decisive that not the force at which the measuring element is deformed by the plunger is predetermined but the distance by which the measuring element is deflected and thus deformed by the plunger, and hence the distance/force characteristic curve and/or, by conversion, the distance/pressure characteristic curve of the MEMS sensor is measured and selected for the purpose of qualifying the component.

As mentioned above, the microelectromechanical semiconductor component may be a pressure sensor. However, a microelectromechanical semiconductor component to be measured according to the invention can also be used as an acceleration sensor or a viscosity sensor. Basically, the invention can be used for checking any microelectromechanical semiconductor component in any conceivable application.

Hereunder the invention is explained in detail with reference to the drawing (FIG. 1).

The drawing schematically illustrates the test setup for a wafer prober 10 comprising a carrier 12 for a silicon wafer 14, for example, in which a plurality of microelectromechanical semiconductor component pressure sensors 16 are configured. Each pressure sensor 16 comprises e. g. a membrane 18 as a reversibly deformable measuring element sensitive to mechanical stresses, in the present case a pressure-sensitive measuring element, for example. The wafer prober 10 further includes a carrier 20 having test needles 22 for contacting terminal pads 24 of the pressure sensors 16. Further, this carrier 20 may comprise electronic components or circuits and a terminal 25 for a cable system 26 extending to a test signal evaluation circuit, for example.

According to the invention, such a wafer prober 10 is modified by providing an actuator 28, e. g. in the form of a piezo-linear motor 30 for step-by-step or continuous forward and backward movement of a needle-shaped deflection plunger 32 serving for mechanically deflecting the pressure sensor membranes 18. The needle-shaped plunger 32 comprises a rounded point 34 which may be configured as a microsphere, for example. For supporting the actuator 28 another carrier 36 is provided which may be arranged above the carrier 20 for the needles 22. The needle-shaped deflection plunger 32 passes through an opening 38 of this carrier 20 and is thus arranged essentially centrically with respect to the (electric) needles 22.

Surprisingly it has turned out that despite the mechanical action on the membranes 18 by contacting the latter with the needle-shaped deflection plunger 32 no damage affecting the functionality of the membranes 18 occurs at the pressure sensors 16 during the test according to the invention. The invention offers, inter glia, the further advantage that the same test setup can be used for various membrane thicknesses such that the test pressure range is not limited in any way. The measurement values determined at variably strong mechanical deflections of the membranes 18 can be correlated with a corresponding air pressure. Thus the semiconductor component as a whole can be qualified. During the mechanical test of the deformable element according to the invention, the latter may be subjected to the same deflections as will occur when used in practice. In particular, during the test the same conditions as prevail during the dedicated use of the component can be simulated. In conventional test methods this has hardly been possible since e. g. pressures of several 10 to 100 bars could not be realized during testing or could only be realized at extreme expenditure.

The measurement setup described above can in particular be used for checking pressure sensors which have to withstand a required burst pressure. At this pressure, which may be a multiple of the nominal pressure, the sensors must not burst. With the aid of the deflection plunger which can be advanced in a distance-controlled manner each pressure sensor can be checked for its ability to withstand the burst pressure. For this purpose, first a reference pressure sensor is checked with the aid of the deflection plunger in that the deflection plunger deforms the measuring element of the reference pressure sensor until said measuring element breaks. The distance covered by the deflection plunger (as from the beginning of deformation) up to this point is known. Subsequently, the measuring elements of the pressure sensors to be checked are deformed with the aid of the deflection plunger to the extent corresponding to the burst pressure that the measuring elements must withstand. During testing it can thus be checked on the wafer whether the pressure sensors are capable or are not capable of passing the burst pressure test.

As an alternative to deflection up to required extent caused by the deflection plunger, the measuring elements may be deflected to a lesser extent and it can then be determined on the basis of the distance/pressure characteristic curve known per se, in particular by extrapolation, whether the currently checked pressure sensor withstands the required maximum pressure (burst pressure).

The invention has been described above on the basis of a pressure sensor which is configured as a microelectromechanical semiconductor component. However, it is understood that the invention can be used for measuring various microelectromechanical semiconductor components which can be employed via reversibly deformable and in particular reversibly bendable measuring elements sensitive to mechanical stresses, which are provided with electronic circuit elements and terminal pads for tapping measurement signals. Therefore the invention is not limited to pressure sensors.

The invention claimed is:

1. A method for checking a pressure sensor having a reversibly deformable, reversibly bendable measuring element which supplies a measurement signal having a value depending on the degree of deformation of said measuring element, to determine whether said pressure sensor withstands a required maximum pressure which is larger by a pre-determinable factor than a nominal pressure for which said pressure sensor is designed, wherein a reference pressure sensor is structurally identical to said pressure sensor to be checked and which comprises a reversibly deformable, reversibly bendable measuring element which supplies a measurement signal having a value depending on the degree of deformation of said measuring element, said reference pressure sensor comprises a deflection plunger that can be advanced in a distance-controlled manner, wherein said deflection plunger is operatively connected to a sensor for determining the force respectively required for advancing said deflection plunger, said deflection plunger is brought into contact with said measuring element of said reference pressure sensor and is subsequently advanced in a distance-controlled manner with reversible deformation of said measuring element, said measuring element is increasingly deformed by said deflection plunger advanced in a distance-controlled manner until said measuring element breaks, the measurement signals supplied by said measuring element during increasing deformation thereof are detected, the distance covered by said deflection plunger from the beginning of the reversible deformation of said measuring element up to breakage of said measuring element is determined, the value of the measurement signal upon maximum reversible deformation of said measuring element, without the measuring element having been broken, is determined as a critical measurement signal, the value of the critical pressure corresponding to the critical measurement signal or the value of a parameter representing said pressure is determined on the basis of the known distance/pressure characteristic curve of said reference pressure sensor, and said measuring element of at least one pressure sensor to be checked is reversibly deformed up to a predeterminable degree by means of said deflection plunger advanced in a distance-controlled manner and its distance/pressure characteristic curve is created, the method comprising:

comparing the created distance/pressure characteristic curve of said pressure sensor to be checked with the known pressure/distance characteristic curve of said reference pressure sensor to identify whether said measuring element of said pressure sensor to be checked withstands the required maximum pressure or would break or would already have been broken at said pressure.

2. The method according to claim 1, wherein the value of the critical pressure corresponding to the critical measurement signal is determined on the basis of the known distance/pressure characteristic curve of the reference pressure sensor by extrapolation thereof up to the value of the critical measurement signal.

3. The method according to claim 1, wherein the static behavior of the pressure sensor is checked.

4. A method for checking a pressure sensor having a reversibly deformable, reversibly bendable measuring element which supplies a measurement signal having a value depending on the degree of deformation of said measuring element, to determine whether said pressure sensor withstands a required maximum pressure which is larger by a pre-determinable factor than a nominal pressure for which said pressure sensor is designed, wherein a reference pressure sensor is provided which is structurally identical to said pressure sensor to be checked and which comprises a reversibly deformable, reversibly bendable measuring element which supplies a measurement signal having a value depending on the degree of deformation of said measuring element, said reference pressure sensor comprises a deflection plunger that can be advanced in a distance-controlled manner, wherein said deflection plunger is operatively connected to a sensor for determining the force respectively required for advancing said deflection plunger, said deflection plunger is brought into contact with said measuring element of said reference pressure sensor and is subsequently advanced in a distance-controlled manner with reversible de-formation of said measuring element, said measuring element is increasingly deformed by said deflection plunger advanced in a distance-controlled manner until said measuring element breaks, the measurement signals supplied by said measuring element during increasing deformation thereof are detected, the distance covered by said deflection plunger from the beginning of the reversible deformation of said measuring element up to breakage of said measuring element is determined, the value of the measurement signal upon maximum reversible deformation of said measuring element, without the latter having been broken, is determined as a critical measurement signal, the value of the critical pressure corresponding to the critical measurement signal or the value of a parameter representing said pressure is determined on the basis of the known distance/pressure characteristic curve of said reference pressure sensor, and the value of the maximum distance of said deflection plunger, at which said measuring element is deformed at the required maximum pressure, is determined based on the value of the maximum distance covered by said deflection plunger from the beginning of the reversible deformation of said measuring element up to its maximum reversible deformation and a distance/pressure characteristic curve of the reference pressure sensor, the method comprising:

deflecting said measuring element of at least one pressure sensor to be checked by means of said distance-controlled deflection plunger;

advancing said deflection plunger by the maximum distance from the contacting point of said measuring element; and checking whether said measuring element withstands the resultant deflection.

5. The method according to claim 4, wherein the value of the critical pressure corresponding to the critical measurement signal is determined on the basis of the known distance/pressure characteristic curve of the reference pressure sensor by extrapolation thereof up to the value of the critical measurement signal.

6. The method according to claim 5, wherein the static behavior of the pressure sensor is checked.

7. The method according to claim 4, wherein static behavior of the pressure sensor is checked.

8. A method for determining the value of a critical pressure which a pressure sensor having a deformable measuring element withstands without breakage of said deformable measuring element, wherein said deformable measuring element supplies a measurement signal with a value varying up to a predetermined degree of reversible deformation in accordance with a known distance/pressure characteristic curve, and wherein the determination of the value of the critical pressure is carried out without the pressure sensor being subjected to the critical pressure, wherein a deflection plunger that can be advanced in a distance-controlled manner is provided, said method comprising:
bringing said deflection plunger into contact with said deformable measuring element and is subsequently advanced in a distance-controlled manner with reversible deformation of said measuring element,
deforming said measuring element by said deflection plunger being advanced until the measuring element breaks,
detecting the measurement signals supplied by said measuring element during increasing deformation thereof,
determining the distance covered by said deflection plunger from the beginning of the deformation of said measuring element up to breakage of the measuring element,
determining a critical measurement signal as the value of the measurement signal upon maximum reversible deformation, without said measuring element having been broken, and
determining the value of the critical pressure corresponding to the critical measurement signal on the basis of the known distance/pressure characteristic curve of said pressure sensor.

9. The method according to claim 8, wherein the value of the critical pressure corresponding to the critical measurement signal is determined on the basis of the known distance/pressure characteristic curve of the reference pressure sensor by extrapolation thereof up to the value of the critical measurement signal.

10. The method according to claim 9, wherein the static behavior of the pressure sensor is checked.

11. The method according to claim 8, wherein the static behavior of the pressure sensor is checked.

12. A system comprising a pressure sensor and a deflection plunger, which can be advanced in a distance-controlled manner, in a configuration for checking the functionality of a reversibly deformable, in particular reversibly bendable measuring element of said pressure sensor by deforming said measuring element by means of said deflection plunger which can be progressively advanced, wherein the force at which said deflection plunger acts upon said measuring element and/or the pressure corresponding to said force which acts upon said measuring element is determined on the basis of measurement signals supplied by said measuring element during increasing deformation thereof.

13. The system of claim 12 wherein the system is used for checking the static behavior of the pressure sensor.

* * * * *